United States Patent [19]
Imbruglia et al.

[11] Patent Number: 5,440,242
[45] Date of Patent: Aug. 8, 1995

[54] CMOS PULL-UP INPUT NETWORK

[75] Inventors: Antonio Imbruglia, Catania; Giovanni Benenati, San Giovani la Punta, both of Italy

[73] Assignee: Consorzio per la Ricerca sulla Microelettronica nel Mezzogiorno, Catania, Italy

[21] Appl. No.: 67,226

[22] Filed: May 26, 1993

[30] Foreign Application Priority Data

May 27, 1992 [EP] European Pat. Off. ............ 92830269

[51] Int. Cl.⁶ .......................................... H03K 17/16
[52] U.S. Cl. ....................................... 326/33; 326/31; 326/83
[58] Field of Search ............... 307/443, 451, 446, 475, 307/246.6, 296.8; 326/31, 33, 34, 82, 83

[56] References Cited

U.S. PATENT DOCUMENTS

| | | |
|---|---|---|
| 4,032,795 | 6/1977 | Hale . |
| 4,472,647 | 9/1984 | Allgood et al. . |
| 4,649,294 | 3/1987 | McLaughlin ................... 307/443 X |
| 4,794,282 | 12/1988 | Colles . |
| 5,227,677 | 7/1993 | Furman ........................... 307/475 X |
| 5,264,744 | 11/1993 | Mizukami et al. ................. 307/475 |
| 5,287,022 | 2/1994 | Wilsher ........................... 307/475 X |

FOREIGN PATENT DOCUMENTS 2113034  8/1983  United Kingdom .

OTHER PUBLICATIONS

Patent Abstracts of Japan, vol. 8, No. 167, (E-358) (1604) Aug. 2, 1984, & JP-A-59064916 (Toshiba KK) Apr. 13, 1984.

Patent Abstracts of Japan, vol. 13, No. 507 (E-845) (3855) Nov. 14, 1989 & JP-A-1204520 (Mitsubishi Electric Corp.) Aug. 17, 1989.

*Primary Examiner*—David R. Hudspeth
*Attorney, Agent, or Firm*—Wolf, Greenfield & Sacks

[57] ABSTRACT

A CMOS logic circuit with biased inputs to a predetermined logic level, being of a type including at least one signal input terminal and logic gates for acting on an input signal, and further including a circuit portion which is connected to the signal input terminal, and includes a high-value resistance effective to bias the input signal.

32 Claims, 3 Drawing Sheets

5,440,242

CMOS PULL-UP INPUT NETWORK

BACKGROUND OF THE INVENTION

1. Field of the Invention

This invention relates to a CMOS logic circuit having inputs biased to a predetermined logic level.

More particularly, the invention relates to a subfamily of high-speed CMOS logic circuits (HCMOS) adapted to replace, in many applications, TTL (Transistor-Transistor Logic) technology devices including low-power Schottky transistors (LSTTL). The description herein below will make reference to this field of application for convenience of illustration.

2. Discussion of Related Art

As is known, CMOS logic circuits are currently gaining increased acceptance on account of their negligible electric current, and hence power, requirements for nearly the same performance as the logic families of the TTL or LSTTL types.

The single drawback of CMOS devices, when used as substitutes for LSTTLs devices, may possibly be that the threshold voltage value Vin whereat commutation of the circuit is established is one half the value of the supply voltage Vdd, the latter lying within the range of 2 to 6 Volts for a HCMOS.

In order to be compatible with TTL logic families, however, the threshold voltage should be a smaller value, e.g. close to a value of 1.3 Volts with a voltage supply in the 4.5 to 5.5 Volts range (as is typical of the LSTTL family).

To fill this requirement, CMOS logic circuits have been proposed which have on their input side at least one inverter with a p-channel MOS of the implanted type and an n-channel MOS. That approach allows the threshold voltage to be lowered, both on account of the p-channel MOS having a higher trigger voltage Vth and because the ratio of the B parameters of the two transistors can be manipulated.

In this way, the threshold voltage of the CMOS circuit can be brought to a compatible value with that of the LSTTL families.

However, with many applications, there is the added requirement that CMOS circuit inputs should be biased to a predetermined logic level dependent on their functions. This requirement is more heavily felt in peripheral units and computer bus connections.

Now, where an LSTTL technology circuit is to be exchanged in applications for which the electronic board designer's goal is to impose a predetermined logic value on the inputs left floating, it is necessary that a bias network comprising external resistances with a high value in the 100 to 300 kOhms be associated with the HCMOS circuit.

All of these requirements are against the current trend toward lower assembling costs, size and power consumption of electronic boards. Such demands are specially notable in the instance of miniaturized assembly procedures carried out using a Surface Mounting technology and of battery powered systems.

A possible remedy to this drawback could be that of incorporating, to the CMOS integrated circuit, a resistance of an appropriate value to each input, but it is quite apparent that such a solution would be unacceptable in terms of occupied silicon area due to the large value that the resistance ought to have.

The underlying technical problem of this invention is to provide a logic circuit of the CMOS type which has such structural and functional characteristics as to overcome the aforementioned drawbacks and affords full compatibility with logic families of the TTL or LSTTL type, to the point of making it feasible to exchange between different family circuits.

Another object of the invention is to reduce the assembly costs, as well as the size and power consumption of electronic boards incorporating the logic circuits. Thus, the reliability of the inventive circuit can be improved over that of the two discrete circuits connected on a board, to provide a single integrated circuit whose overall performance can be guaranteed by the manufacturer.

The solutive idea on which this invention stands is one of providing an equivalent bias resistor within the CMOS technology integrated circuit.

SUMMARY OF THE INVENTION

Based on this solutive idea, the technical problem is solved by a logic circuit including at least one input signal terminal receiving at least one input signal. First and second gates are coupled to one another and to the at least one input terminal, and act on the at least one input signal. A circuit portion is coupled to the input terminal and includes a high value resistance biasing the input signal.

BRIEF DESCRIPTION OF THE DRAWINGS

The features and advantages of a circuit according to the invention will become apparent from the following detailed description of an embodiment thereof, given by way of non-limitative example with reference to the accompanying drawings.

In those drawings.

DETAILED DESCRIPTION

Figure 1:
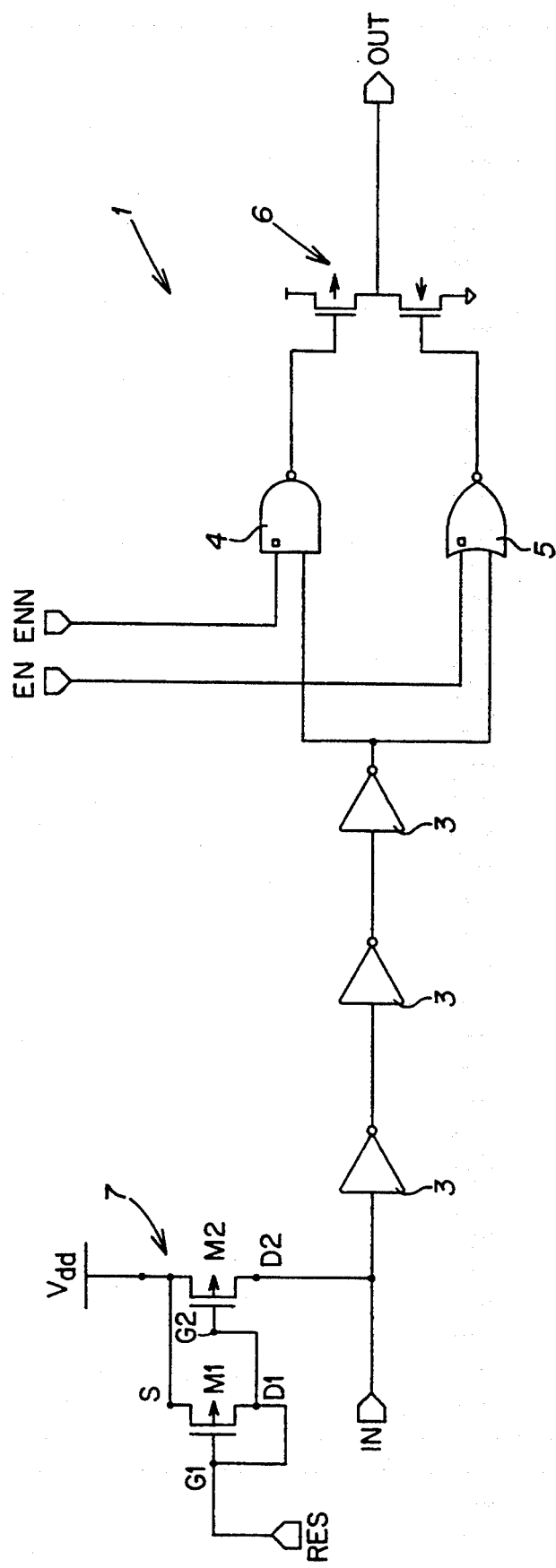
FIG. 1 is a diagramatic representation of a CMOS logic circuit embodying this invention.

With reference to the drawing figures, generally and schematically shown at 1 is a logic circuit implemented in the CMOS technology, in accordance with this invention.

The circuit 1 has a signal or data input IN and an output OUT.

Provided after the input IN are a set of cascade-connected inverters 3, each implemented in the CMOS technology with a p-channel MOS transistor being associated with an n-channel MOS transistor. In a first of the inverters, namely the external one that is to exhibit a TTL-compatible switch threshold, the p-channel MOS transistor has a higher trigger voltage Vthp, and by adjustment of the ratio of the $\beta$ parameters of the two transistors, an unbalanced inverter can be obtained which operates with a switch threshold Vin compatible with the typical levels of the TTL logic families.

Basically, the threshold voltage on the input IN would be defined by the following relation:

$$Vin = [Vdd + Vth_p + Vth_n (\beta n/\beta p)]/[1 + (\beta n/\beta p)] \quad (1)$$

where: Vdd is the supply voltage (approximately 5 Volts) and $Vth_n$ is the threshold voltage for the n-channel MOS transistor.

The output of the last inverter 3 in the cascade connection is connected to respective inputs of two logic gates 4 and 5 which receive, on other inputs, respective enable signals ENN and EN.

Each logic gate 4, 5 has its output side connected to a corresponding gate electrode of a MOS transistor pair 6 being connected into an inverter configuration and having their connection point arranged to coincide with the output OUT of circuit 1.

Advantageously, according to the invention, the circuit 1 has a circuit portion 7 connected to said signal input IN and being the equivalent of a high value resistance capable of biasing the input IN.

More specifically, this portion 7 is a current mirror comprising a pair of transistors, M1 and M2. These transistors are preferably an enhancement p-channel MOS type and have the source electrode S in common.

Figure 3:
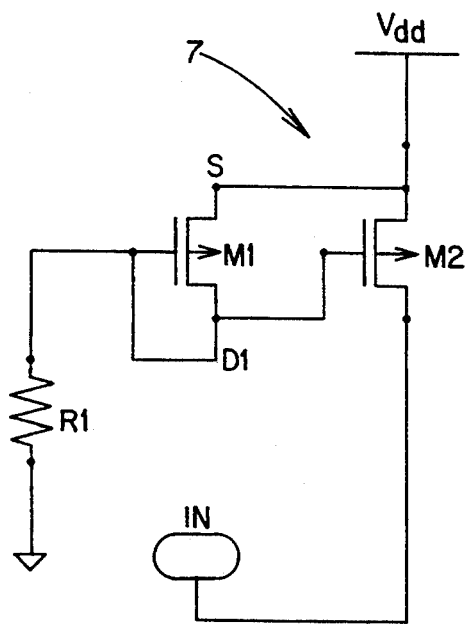
FIG. 3 shows a detail of the circuit in FIG. 1.

The drain D1 of the first transistor M1 is connected to both the gate G1 of that same transistor and the gate G2 of the second transistor M2. The drain D2 of the second transistor is connected to the data input IN of circuit 1. Also, the gate G1 is associated with a terminal RES for its connection to ground or, alternatively, to a reference potential via a resistor R1, as shown more detailedly in FIG. 3.

Therefore, the first transistor M1 in the mirror 7 and the resistor R1 will be unrelated to changes in the input voltage Vin and form a current generator whose value is stable even if Vin may vary.

The second transistor M2 supplies, in turn, a near-constant current IIL until the value of the input voltage Vin approaches that of the voltage supply Vdd. In this way, the drain-to-source voltage drop Vds across the transistor can be reduced.

As brought out by the foregoing considerations, the transistors M1 and M2 will exhibit the same gate-to-source voltage drop Vgs, thereby to ensure proper operation of the current mirror structure and proper biasing of the input IN.

By appropriate selection of the width to length ratio W/L for the channel region of the second transistor M2, the value of the current flowing through that transistor can be decreased, with obvious fan-out advantages for the drive circuits upstream from circuit 1.

Figure 2:
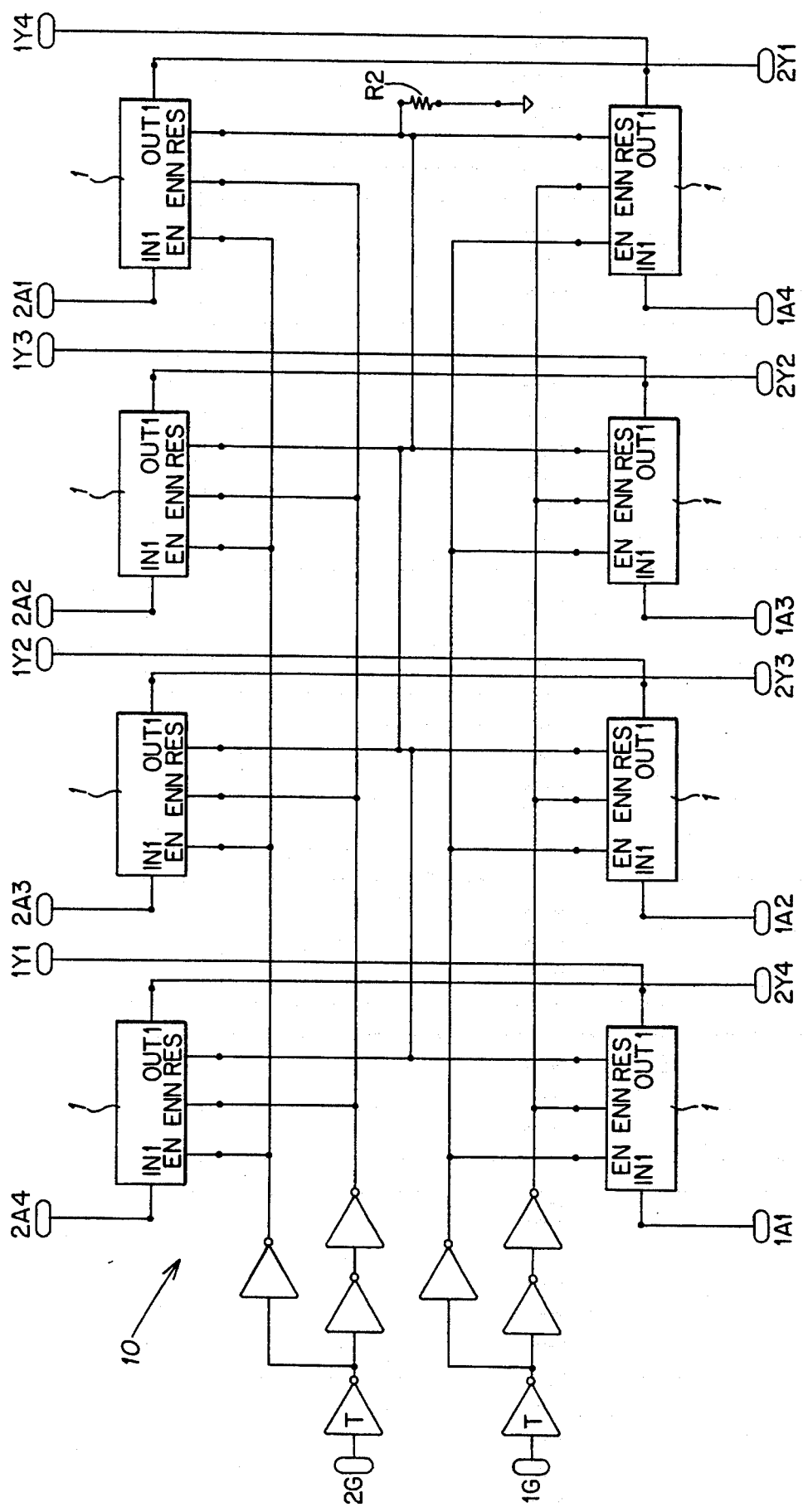
FIG. 2 is a diagramatic representation of a CMOS technology integrated circuit incorporating the circuit of this invention.

An exemplary use of the circuit 1 according to the invention will now be described with reference to FIG. 2.

This circuit has been embedded in an integrated circuit 10 of the bus buffer type, also known as octal IC in the art since it includes eight circuits 1 arrayed on the IC.

The circuit 10 has two enable inputs 1G and 2G which are connected, via some inverters T, to the various inputs ENi and ENNi of the logic gates 4 and 5 of each circuit 1. The circuit 10 also has plural outputs OUTi of the so-called inverted 3-state type whose basic feature is that they will not load the data buses while disabled.

Each circuit 1 is connected in the IC 10 with the signal input IN led to a corresponding data input 1Ai or 2Ai.

Advantageously in this invention, the terminals RES of the plural circuits 1 are all connected to ground through a single resistor R2 integrated, in turn, to the circuit 10.

This resistor R2 is formed in a well of the p type by a conventionally known process. Thus substantial savings can be achieved in the silicon area, as the resistor R2 is shared by the eight inputs RES of the CMOS circuits 1.

In order for the resistor R2 to be the full equivalent of the resistor R1 associated with the current mirror 7, it is selected to have a value which is n times that of R1, where n is the number of the circuits 1 embedded in the IC 10. Thus, since in the example being discussed, n is equal to eight, the savings in silicon area will be, in the connection used herein, n times the area to be occupied by a resistor of design value.

Figure 4:
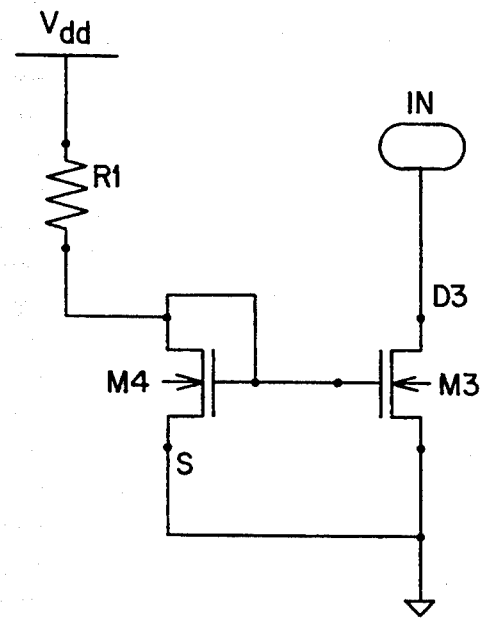
FIGS. 4 and 5 are respective diagramatic representations of variants of the inventive circuit.

It is understood that the circuit 1 of this invention may be implemented in the so-called dual form. An example of this possible embodiment is shown in FIG. 4, wherein the current mirror portion 7 of FIG. 1 is implemented by a pair of n-channel MOS transistors M3 and M4 having gate electrodes in common. These transistors also have in common their source electrodes, with the latter being connected to ground as well.

The resistor R1 is connected, in this embodiment, to the voltage supply Vdd, whereas the drain D3 of the first transistor M3 in the pair is connected to the input IN. Briefly, this solution results in the inputs IN being fixed at a logic low.

Figure 5:
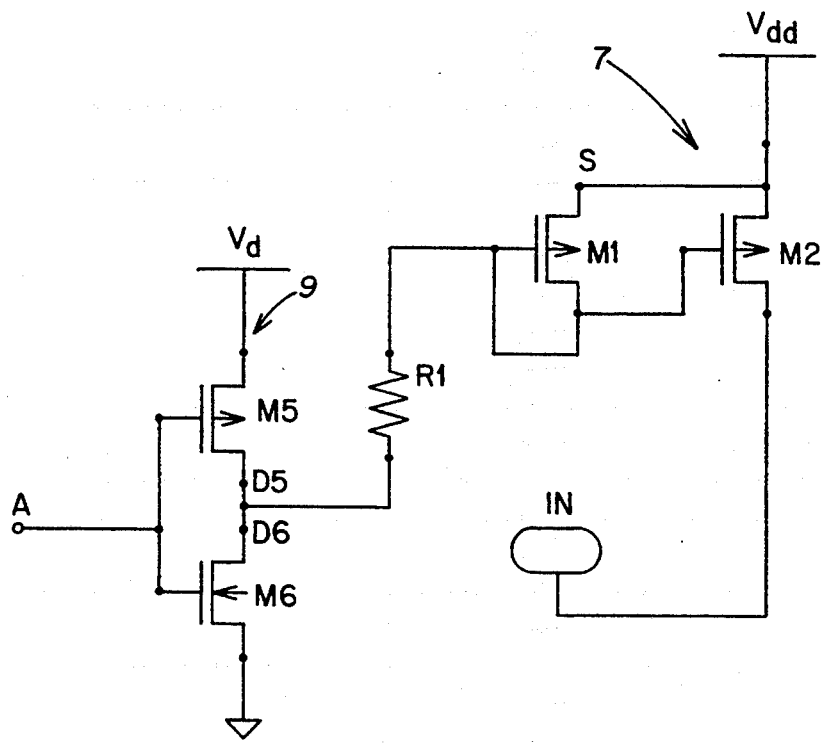

A variant of this invention is illustrated by FIG. 5.

In this variant, an inverter 9 is connected to the resistor R1. More particularly, the inverter 9 comprises a pair of MOS transistors M5, M6 having their gates in common and both connected to a terminal A to receive an enable signal.

One of the transistors M5, M6 is a p-channel type and the other an n-channel type, and are both connected between the voltage supply Vdd and ground. The junction between the drains D5 and D6 of these transistors is connected to one end of the resistor R1.

Thus, a turn-off circuit is provided which is effective to cut off the current mirror 7, and hence the input IN, under control by the enable signal on the terminal A.

The above embodiments of the inventive logic circuit do solve, therefore, the technical problem and afford a number of advantages, ensuring, in the first place, full exchangeability of different families of logic circuits for the same function.

Another major advantage of the invention is that the lower power draw of the CMOS circuit provides an improved fan-out value at the drive gate. In addition, the linear pattern of the current IIL fed to the input at voltage Vin provides a near-constant value for the current with input voltages Vin that lie quite close to the supply voltage.

It should be noted, moreover, that the solution provided by this invention results in a uniquely flat input characteristic, being a definite improvement on that to be obtained through the use of a high-value integrated resistor.

The resultant integrated circuit from embedding the inventive CMOS circuit therein, has involved a very modest increase in the circuit area as a trade-off for improved overall reliability.

While the invention has been described herein with reference to a particular exemplary embodiment, it was intended to be non-limiting. Those skilled in the art will readily appreciate that numerous modifications and alterations can be made to the disclosed embodiments without departing from the spirit or scope of the invention as defined by the appended claims and their equivalents.

What is claimed is:

1. A CMOS logic circuit having inputs biased to a predetermined logic level and comprising at least one signal input and logic gates for handling said signal, and a circuit portion connected to said signal input and including a transistor, coupled between the signal input and a voltage supply terminal, that is biased to operate in a linear mode, the transistor being configured to bias the signal input to the predetermined logic level.

2. A CMOS logic circuit having inputs biased to a predetermined logic level and comprising at least one signal input and logic gates for handling said signal, and a circuit portion connected to said signal input and being the equivalent of a high-value resistance adapted to bias said input, wherein said circuit portion is a current mirror connected between a reference potential and said input signal.

3. A logic circuit according to claim 2, wherein said reference potential is either a supply pole or a signal ground.

4. A logic circuit according to claim 2, wherein said current mirror comprises a pair of p-channel MOS transistors.

5. A logic circuit according to claim 2, wherein said current mirror comprises a pair of n-channel MOS transistors.

6. A logic circuit according to claim 2, further comprising a resistor connected between an input of said current mirror and ground.

7. A circuit according to claim 2, wherein the circuit is embedded in an integrated circuit together with a resistor having a predetermined value and an input of said current mirror connected thereto.

8. A logic circuit according to claim 7, wherein said resistor is formed in a p-type well.

9. A circuit according to claim 7, wherein said resistor has a value which is n times said resistance, where n is the number of the logic circuits embedded in the integrated circuit.

10. A circuit according to claim 6, wherein said resistor has a value which is n times said resistance, where n is the number of logic circuits embedded in the integrated circuits.

11. A logic circuit as claimed in claim 10 wherein the circuit portion further includes a turn-off circuit, controlled by an enable signal, operative to cut off biasing of the input signal.

12. A logic circuit according to claim 6, further comprising a turn-off circuit of said circuit portion operative to cut off the input bias under control by an enable signal.

13. A circuit according to claim 12, wherein said turn-off circuit is an inverter connected to one end of said resistor.

14. A logic circuit as claimed in claim 9 wherein the circuit portion further includes a turn-off circuit, controlled by an enable signal, operative to cut off biasing of the input signal.

15. A CMOS logic circuit having inputs biased to a predetermined logic level and comprising at least one signal input and logic gates for handling said signal, and a circuit portion connected to said signal input and being the equivalent of a high-value resistance adapted to bias said input, wherein a turn-off circuit of said circuit portion is operative to cut-off the input bias under control by an enable signal.

16. A logic circuit according to claim 15 further comprising a resistor connected between an input of said current mirror and ground.

17. A circuit according to claim 16, wherein said turn-off circuit is an inverter connected to one end of said resistor.

18. A CMOS logic circuit including inputs biased to a predetermined logic level, the circuit comprising:
at least one input signal terminal receiving at least one input signal;
first and second logic gates coupled to one another and to the at least one input terminal, acting on the at least one input signal; and
a first transistor coupled between the input signal terminal and a voltage supply terminal, that is biased to operate in a linear mode.

19. A CMOS logic circuit including inputs biased to a predetermined logic level, the circuit comprising:
at least one input signal terminal receiving at least one input signal;
first and second logic gates coupled to one another and to at least one input terminal, acting on the at least one input signal;
a circuit portion coupled to the input terminal and including a high-value resistance biasing the input signal; and
a reference potential terminal receiving a reference potential voltage and wherein the circuit portion further includes a current mirror connected between the reference potential terminal and the input signal terminal.

20. A logic circuit as claimed in claim 19 wherein the reference potential voltage includes ground.

21. A logic circuit as claimed in claim 19 wherein the reference potential voltage includes a supply pole.

22. A logic circuit as claimed in claim 19 wherein the current mirror includes first and second p-channel MOS transistors.

23. A logic circuit as claimed in claim 19 wherein the current mirror includes first and second n-channel MOS transistors.

24. A logic circuit as claimed in claim 19 further including a first resistor coupled between the current mirror and ground.

25. A logic circuit as claimed in claim 24 wherein the circuit portion further includes a turn-off circuit, controlled by an enable signal, operative to cut off biasing of the input signal.

26. A logic circuit as claimed in claim 25 wherein the turn-off circuit includes an inverter connected to the first resistor.

27. A logic circuit as claimed in claim 19 wherein the circuit is an integrated circuit structure, the circuit further including a resistor of a predetermined value coupled to the current mirror.

28. A logic circuit as claimed in claim 27 wherein the resistor is defined in a p-type well of the integrated circuit structure.

29. A logic circuit as claimed in claim 24 wherein the circuit is an integrated circuit structure, the circuit further including a second resistor of a predetermined value coupled to the current mirror.

30. A logic circuit as claimed in claim 29 wherein a number n of the circuits are embedded in an integrated circuit and wherein the second resistor has a value n tinges a value of the first resistor.

31. A CMOS logic circuit including inputs biased to a predetermined logic level, the circuit comprising:

an input signal terminal receiving an input signal;

logic circuitry coupled to the input signal terminal; and a current mirror coupled to the input signal terminal that biases the input signal.

32. A CMOS logic circuit including inputs biased to a predetermined logic level, the circuit comprising:

an input signal terminal receiving an input signal;

logic circuitry coupled to the input signal terminal; and a current mirror that controls a current that biases the input signal.

* * * * *